(12) United States Patent
Chen et al.

(10) Patent No.: US 11,081,461 B2
(45) Date of Patent: Aug. 3, 2021

(54) PACKAGING PROCESS AND PACKAGING STRUCTURE

(71) Applicant: Delta Electronics Int'l (Singapore) Pte Ltd, Singapore (SG)

(72) Inventors: Chien-Ming Chen, Singapore (SG); Beng Beng Lim, Singapore (SG)

(73) Assignee: DELTA ELECTRONICS INT'L (SINGAPORE) PTE LTD, Singapore (SG)

(*) Notice: Subject to any disclaimer, the term of this patent is extended or adjusted under 35 U.S.C. 154(b) by 0 days.

(21) Appl. No.: 16/824,021

(22) Filed: Mar. 19, 2020

(65) Prior Publication Data
US 2020/0219837 A1 Jul. 9, 2020

Related U.S. Application Data

(62) Division of application No. 16/262,363, filed on Jan. 30, 2019.

(30) Foreign Application Priority Data

Nov. 12, 2018 (SG) .......................... 10201810052W

(51) Int. Cl.
| | | |
|---|---|---|
| H01L 21/48 | (2006.01) | |
| H01L 23/367 | (2006.01) | |
| H01L 23/498 | (2006.01) | |
| H01L 23/00 | (2006.01) | |
| H01L 21/683 | (2006.01) | |

(52) U.S. Cl.
CPC .......... *H01L 24/19* (2013.01); *H01L 21/4857* (2013.01); *H01L 21/4871* (2013.01); *H01L 21/6835* (2013.01); *H01L 23/3675* (2013.01); *H01L 23/49822* (2013.01); *H01L 23/49838* (2013.01); *H01L 24/20* (2013.01); *H01L 24/97* (2013.01); *H01L 2221/68345* (2013.01); *H01L 2224/95001* (2013.01)

(58) Field of Classification Search
None
See application file for complete search history.

(56) References Cited

U.S. PATENT DOCUMENTS

| | | |
|---|---|---|
| 5,561,323 A | 10/1996 | Andros et al. |
| 9,214,447 B2 | 12/2015 | Bai et al. |
| 9,324,637 B1 | 4/2016 | Bai et al. |
| 9,455,216 B2 | 9/2016 | Daniels et al. |
| 9,735,114 B1 | 8/2017 | Xu et al. |
| 2005/0056928 A1 | 3/2005 | Kwon et al. |

(Continued)

*Primary Examiner* — Xiaoming Liu
(74) *Attorney, Agent, or Firm* — Kirton McConkie; Evan R. Witt

(57) ABSTRACT

A packaging process and a packaging structure of an electronic component are provided. By the packaging process and the packaging structure of the disclosure, the groove of the thermal conduction structure is covered by the first metal re-distribution layer. Therefore, the flank of the thermal conduction structure is easy to coat the conducting material. Moreover, because the flank of the thermal conduction structure is coated, the surface of the flank of the thermal conduction structure is difficulty oxidized. Furthermore, the conducting material between the thermal conduction structure and the board is flat, so that automated optical inspection of the packaging structure is easy to implement.

15 Claims, 14 Drawing Sheets

(56) References Cited

U.S. PATENT DOCUMENTS

| | | |
|---|---|---|
| 2005/0186704 A1 | 8/2005 | Yee et al. |
| 2010/0187670 A1 | 7/2010 | Lin et al. |
| 2014/0151865 A1* | 6/2014 | Koschmieder .... H01L 23/49555 257/676 |
| 2016/0013148 A1* | 1/2016 | Lin ..................... H01L 23/5389 257/773 |
| 2016/0233140 A1* | 8/2016 | Lai .......................... H01L 24/19 |

* cited by examiner

PACKAGING PROCESS AND PACKAGING STRUCTURE

CROSS-REFERENCE TO RELATED APPLICATION

This application is a Divisional Application of U.S. patent application Ser. No. 16/262,363 filed on Jan. 30, 2019 and entitled "PACKAGING PROCESS AND PACKAGING STRUCTURE", which claims priority to Singapore patent application No. 10201810052 W filed on Nov. 12, 2018 and entitled "PACKAGING PROCESS AND PACKAGING STRUCTURE", the entirety of which is hereby incorporated by reference.

FIELD OF THE INVENTION

The present invention relates to a packaging process and a packaging structure, and more particularly to a packaging process and a packaging structure of an electronic component with a wettable flank structure.

BACKGROUND OF THE INVENTION

Recently, the general trends in designing electronic devices are toward small size, light weightiness and easy portability. Moreover, with the increasing development of electronic industries, the internal circuitries of the electronic devices are gradually modularized. In other words, plural electronic components are integrated into a single electronic module. For example, a power module is one of the widely-used electronic modules. An example of the power module includes but is not limited to a DC-to-DC converter, a DC-to-AC converter or an AC-to-DC converter. After the electronic components (e.g. integrated circuit (IC) chips, capacitors, resistors, inductors, transformers, diodes and transistors) are integrated as a power module, the power module may be installed on a motherboard or a system circuit board.

Nowadays, quad flat no leads (QFN) package structure is a popular embedded structure where the lead frames are exposed at a bottom and at sides of the package. The quad flat no leads package structure doesn't outstretch pins from different side of the package. The quad flat no leads package structure is widely adopted because of many advantages such as smaller volume, cheaper cost, better production process yield and better radiating.

However, the bottom of the traditional quad flat no leads package structure has been electroplated to connect the printed circuit board through the solder, but the lead frame of the package is cut to expose the surface of the lead frame on the flank of the quad flat no leads package, and the surface of the flank of the quad flat no leads package has not been electroplated. Therefore, the flank of the quad flat no leads package is difficult to coat solder because of no electroplating. Moreover, the surface of the flank of the quad flat no leads package is oxidized easily. Furthermore, the solder connected between the lead frame of the quad flat no leads package and the printed circuit board is easily formed a protrusion outstretched on the outward appearance of the printed circuit board. Therefore, the protrusion causes difficult implementation of automated optical inspection. Although a concave is formed on the lead frame by etching method to solve the difficult implementation of automated optical inspection, but the concave is only formed on the lead frame of the bottom side of one kind of the traditional quad flat no leads package structure. Therefore, for forming the concave of the lead frame by etching method, position of the lead frame is limited.

Therefore, there is a need of providing an improved packaging process and packaging structure in order to eliminate the above drawbacks.

SUMMARY OF THE INVENTION

An object of the present invention provides a packaging process and packaging structure. The package structure has wettable flanks. The wettable flank of the packaging structure is easy to coat conducting material and can make sure the formation of solder fillet at the power module's side wall and make the automated optical inspection possible.

An aspect of an embodiment of the present invention provides a packaging process. Firstly, a semi-package unit is provided. The semi-package unit comprises an electronic component, a thermal conduction structure, a first metal layer, a second metal layer and an insulation structure. The electronic component, the thermal conduction structure, the first metal layer and the second metal layer are embedded within the insulation structure. The first metal layer is attached on the electronic component. The second metal layer is attached on the thermal conduction structure. Then, a portion of the insulation structure is removed to form at least one concave disposed on an edge of the semi-package unit. A portion of insulation structure is removed to form plural first openings on one side of the semi-package unit and expose the first metal layer and the second metal layer. Then, a first metal re-distribution layer is formed to connect the insulation structure, the first metal layer and the second metal layer. Then, plural second openings are formed on the first metal re-distribution layer. A first mask is formed on the second opening.

Another aspect of an embodiment of the present invention provides a packaging structure. The packaging structure includes an electronic component, a thermal conduction structure, a first metal layer attached on the electronic component, a second metal layer attached on the thermal conduction structure, and an insulation structure comprising a groove and plural first openings. The electronic component, the thermal conduction structure, the first metal layer and the second metal layer are embedded within the insulation structure. A first metal re-distribution layer is contacted with the thermal conduction structure and one side of the second metal layer through the groove and contacted with the first metal layer and the other side of the second metal layer through the plural first openings.

The above contents of the present invention will become more readily apparent to those ordinarily skilled in the art after reviewing the following detailed description and accompanying drawings, in which:

DETAILED DESCRIPTION OF THE PREFERRED EMBODIMENT

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

Figure 1A:
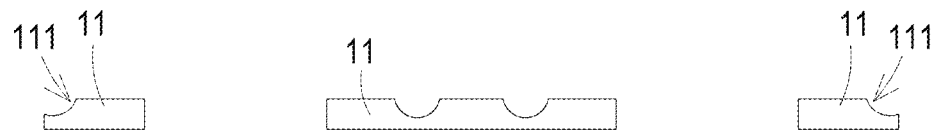
FIGS. 1A to 1X are schematic cross-sectional views illustrating a packaging process of an electronic component according to a first embodiment of the present invention.
Figure 1B:
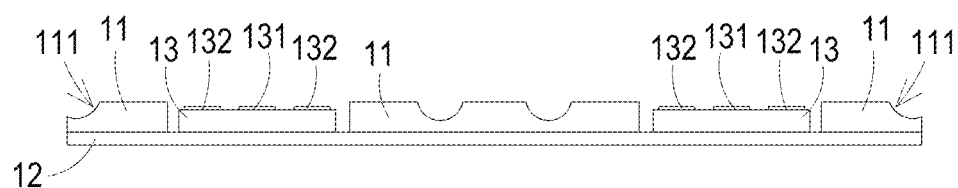
Figure 1C:
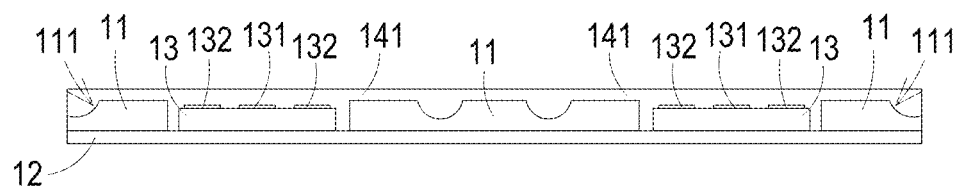
Figure 1D:
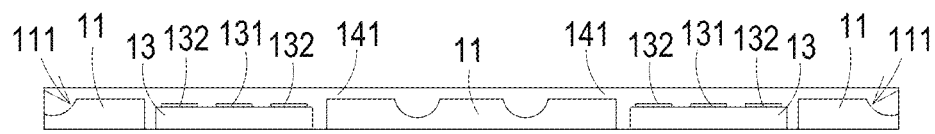
Figure 1E:
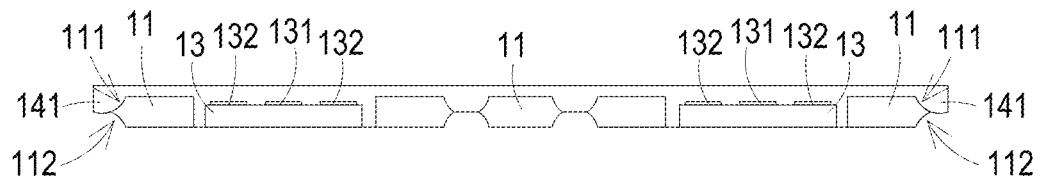
Figure 1F:
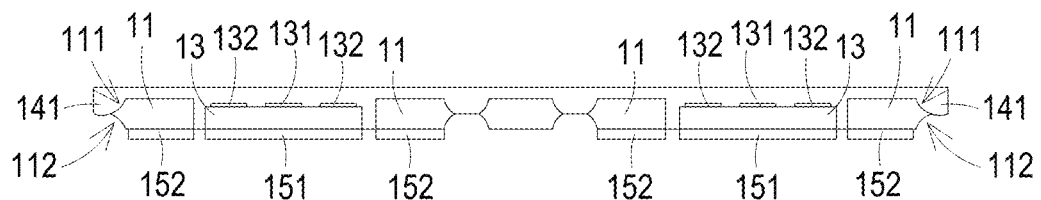
Figure 1G:
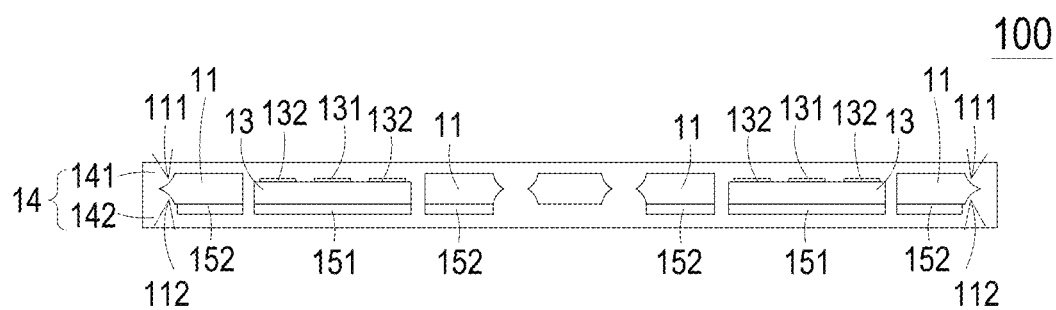
Figure 1H:
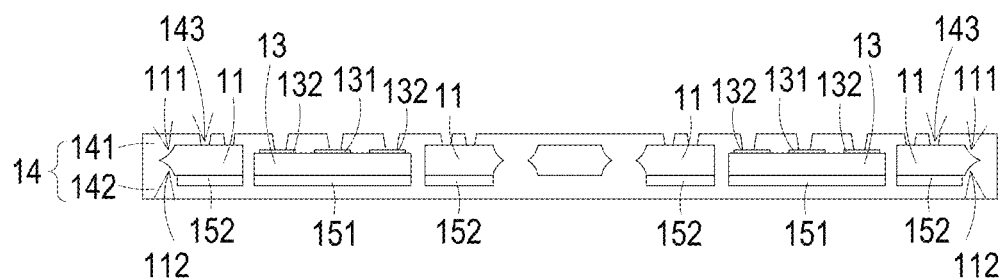
Figure 1I:
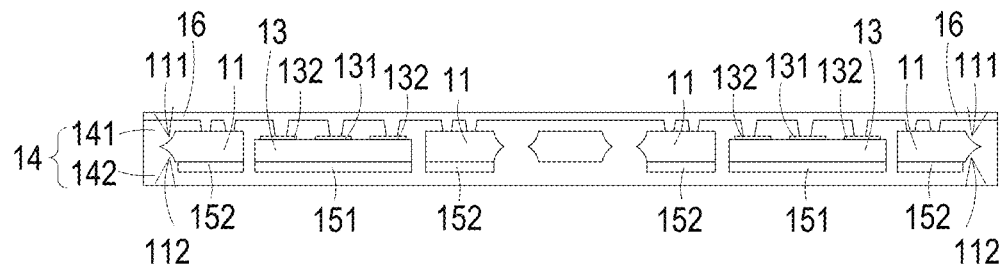
Figure 1J:
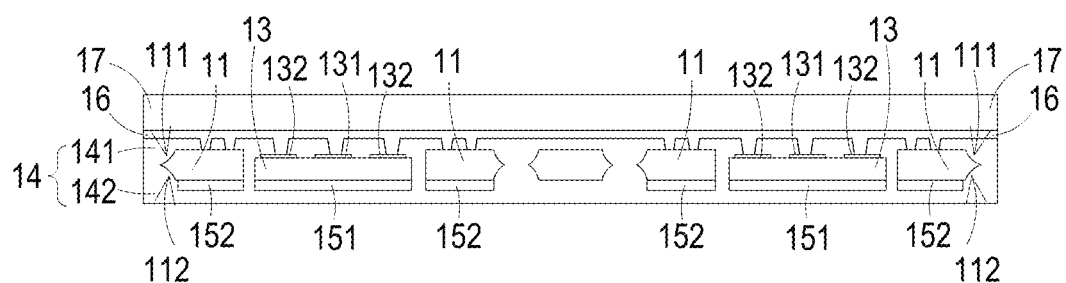
Figure 1K:
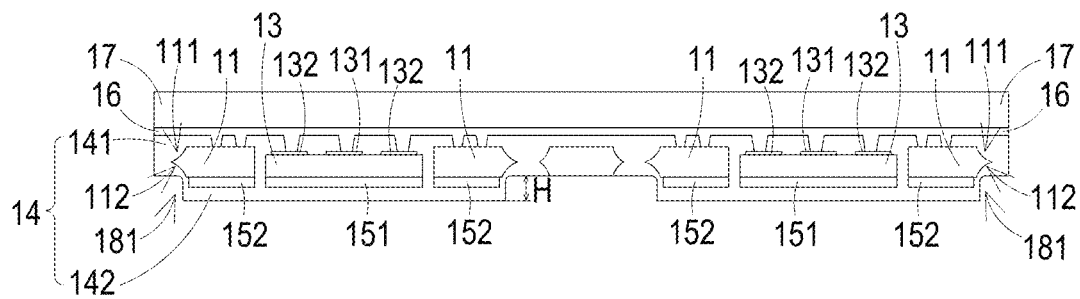
Figure 1L:
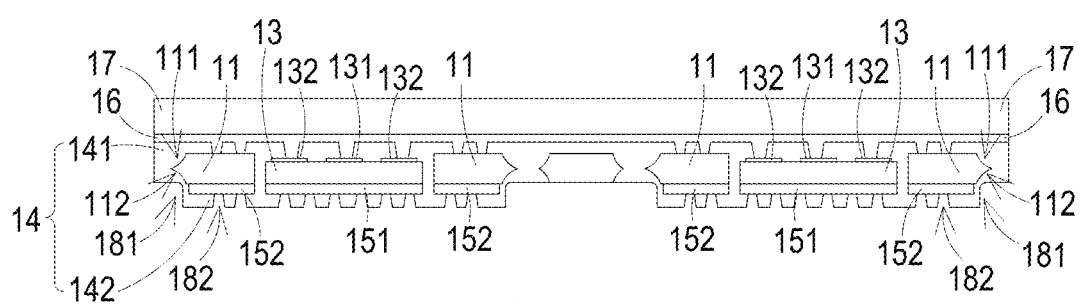
Figure 1M:
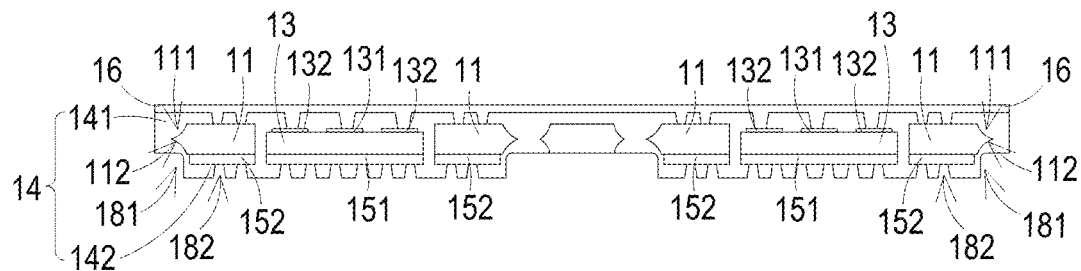
Figure 1N:
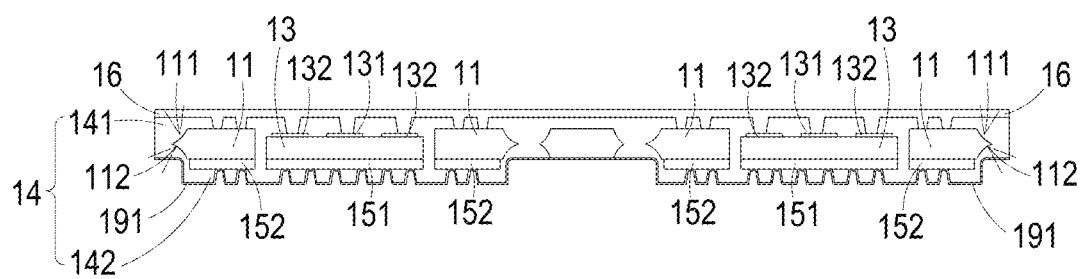
Figure 1O:
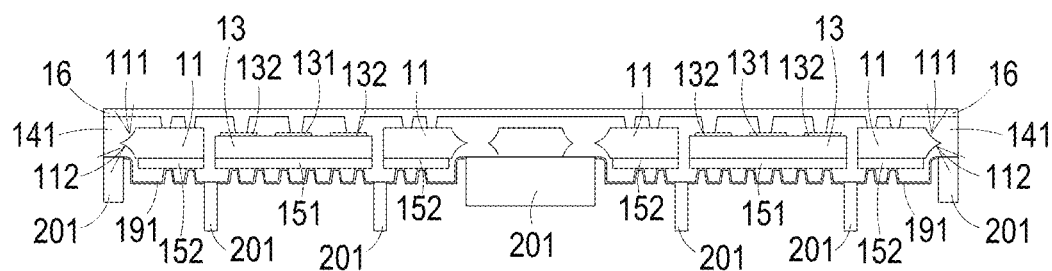
Figure 1P:
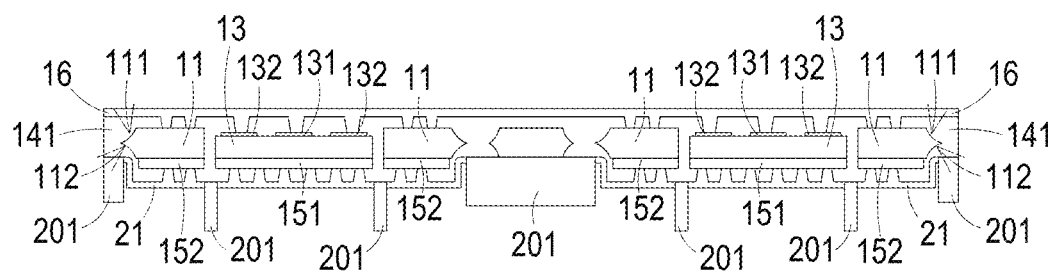
Figure 1Q:
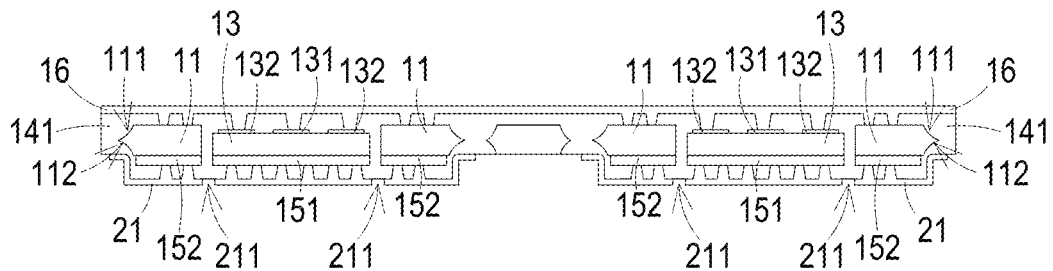
Figure 1R:
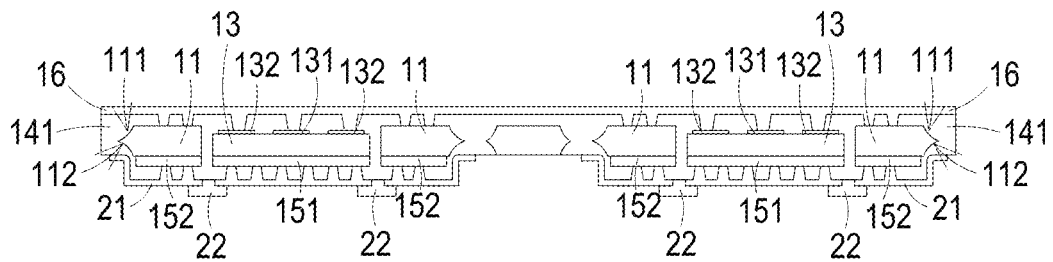
Figure 1S:
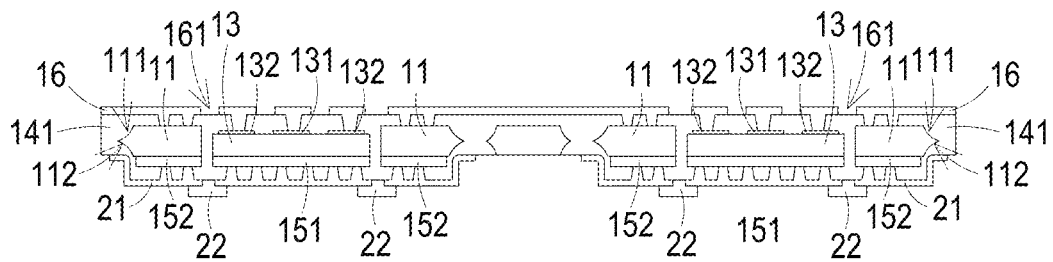
Figure 1T:
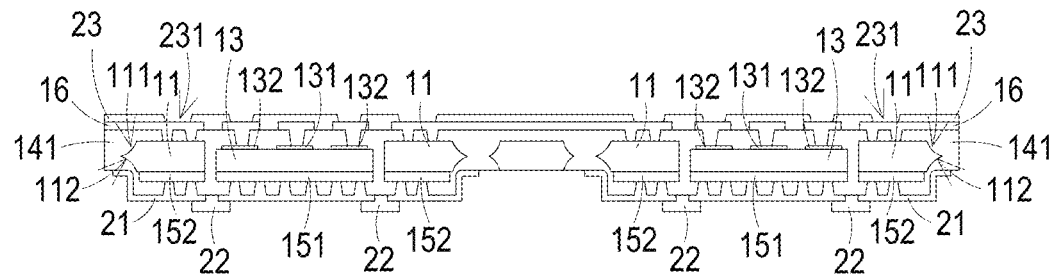
Figure 1U:
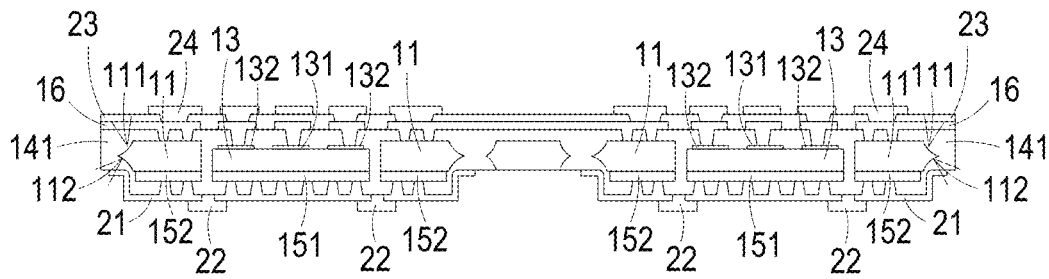
Figure 1V:
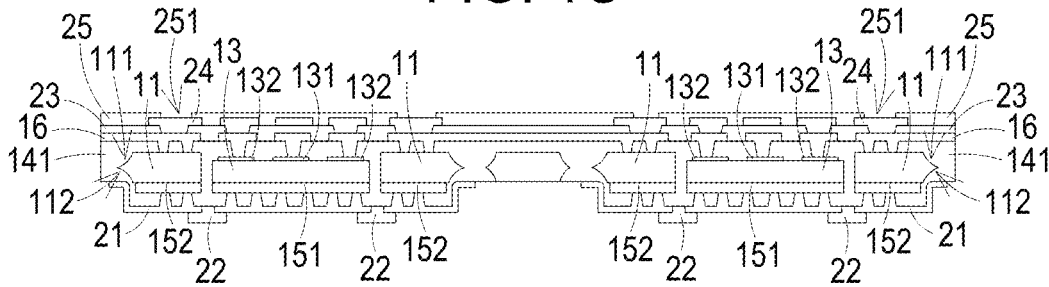
Figure 1W:
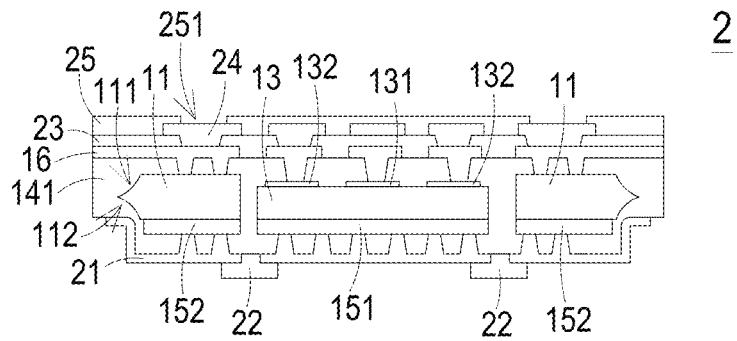
Figure 1X:
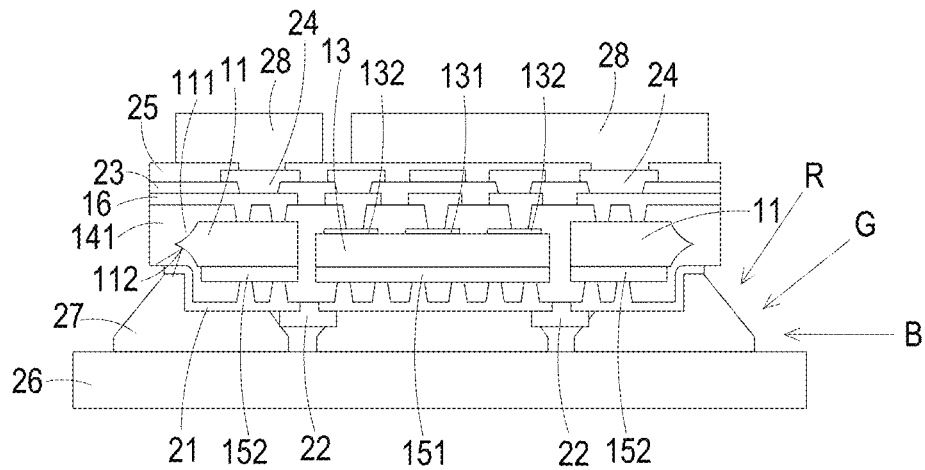

FIGS. 1A to 1X are schematic cross-sectional views illustrating a packaging process of an electronic component according to a first embodiment of the present invention.

Firstly, as shown in FIG. 1A, at least one thermal conduction structure 11 is provided. A first recess 111 is formed on one side of the corresponding thermal conduction structure 11, especially along an edge of the corresponding thermal conduction structure 11. In an embodiment, the first recess 111 is formed by a chemical etching process. Then, as shown in FIG. 1B, a first carrier 12 and an electronic component 13 are provided. In an embodiment, the first carrier 12 is a thermal release tape or a polyimide tape. One side of the electronic component 13 comprises at least one first conducting terminal 131 and at least one second conducting terminal 132. In some embodiments, the thermal conduction structure 11 is implemented by a metallic lead frame. In some other embodiments, the thermal conduction structure 11 is implemented by a PCB substrate or a ceramic substrate with a good thermally conductive property. In some embodiments, the first conducting terminal 131 and the second conducting terminal 132 are made of copper, aluminum, silver, gold, or any other appropriate metallic material.

The electronic component 13 may be an active component or a passive component. An example of the electronic component 13 includes but is not limited to an integrated circuit (IC) chip, an integrated power component, a metal-oxide-semiconductor field-effect transistor (MOSFET), a high electron mobility transistor (HEMT), an insulated-gate bipolar transistor (IGBT), a diode, a capacitor, a resistor, an inductor or a fuse. The number of the first conducting terminal 131 and the second conducting terminal 132 of the electronic component 13 are determined according to the type and the configuration of the electronic component 13. As shown in FIG. 1B, the electronic component 13 may be an integrated circuit (IC) chip. According to the configuration of the IC chip, the electronic component 13 has one first conducting terminal 131 and two second conducting terminals 132. In an embodiment, the electronic component 13 is a power IC chip while the first conducting terminal 131 is a gate terminal and two second conducting terminals 132 are source and drain terminals.

Please refer FIG. 1B again, the thermal conduction structure 11 and the other side of the electronic component 13 are attached on the first carrier 12. Therefore, the first recess 111 of the thermal conduction structure 11, the first conducting terminal 131 and the second conducting terminal 132 of the electronic component 13 are exposed. Besides, the first recess 111 of the thermal conduction structure 11 is disposed in the edge of the thermal conduction structure 11 away from the electronic component 13 or within the thermal conduction structure 11.

Then, as shown in FIG. 1C, a first insulation layer 141 is provided and laminated on one side of the thermal conduction structure 11 and one side of the electronic component 13. Namely, the first recess 111 of the thermal conduction structure 11, the first conducting terminal 131 and the second conducting terminal 132 of the electronic component 13 are covered by the first insulation layer 141. In an embodiment, the first insulation layer 141 includes a resin or any other appropriate insulation material.

Then, as shown in FIG. 1D, the first carrier 12 is removed. Therefore, the other side of the electronic component 13 and the other side of the thermal conduction structure 11 are exposed. Then, as shown in FIG. 1E, a portion of the thermal conduction structure 11 is removed. Therefore, a second recess 112 is formed on the other side of the corresponding thermal conduction structure 11, especially along the other edge of the corresponding thermal conduction structure 11. In an embodiment, the second recess 112 is formed by a chemical etching process. The conformation of the first recess 111 and the corresponding second recess 112 make a sharp structure of the thermal conduction structure 11.

Then, as shown in FIG. 1F, a first metal layer 151 and a second metal layer 152 are provided. The first metal layer 151 is formed on the other side of the electronic component 13. The second metal layer 152 is formed on the other side of the thermal conduction structure 11.

Then, as shown in FIG. 1G, a second insulation layer 142 is provided. The second insulation layer 142 is formed to cover the first metal layer 151 and the second metal layer 152. Moreover, the first insulation layer 141 and the second insulation layer 142 are formed into an insulation structure 14. Furthermore, the insulation structure 14, the electronic component 13, the thermal conduction structure 11, the first metal layer 151 and the second metal layer 152 are formed into a semi-package unit 100. In an embodiment, the second insulation layer 142 includes a resin or any other appropriate insulation material with suitable mechanical strength and thermal conductivity.

Then, as shown in FIG. 1H, plural third openings 143 are formed on one side of the semi-package unit 100. The plural third openings 143 are corresponding to the thermal conduction structure 11, the first conducting terminal 131 and the second conducting terminal 132. A portion of the thermal conduction structure 11, the first conducting terminal 131 and the second conducting terminal 132 of the electronic component 13 are exposed through the corresponding third openings 143. In an embodiment, a portion of the first insulation layer 141 is removed by a laser drilling process or chemical etching process to form the plural third openings 143.

Then, as shown in FIG. 1I, a second metal re-distribution layer 16 is provided. The second metal re-distribution layer 16 is formed on the first insulation layer 141 of the insulation structure 14. The second metal re-distribution layer 16 is connected with the thermal conduction structure 11, the first conducting terminal 131 and the second conducting terminal 132 of the electronic component 13 through the corresponding third openings 143.

Then, as shown in FIG. 1J, a second carrier 17 is provided. The second carrier 17 is attached on the second metal re-distribution layer 16.

Then, as shown in FIG. 1K, a portion of the insulation structure 14 is removed, wherein an edge of the insulation structure 14 is formed as a groove. The groove of the insulation structure 14 is defined as a concave 181. The concave 181 is disposed on the edge of the semi-package unit 100. In an embodiment, the concave 181 is formed by a dicing saw process. Preferably but not exclusively, the depth H of the concave 181 is 100 µm.

Then, as shown in FIG. 1L, a portion of the insulation structure 14, such as a portion of the second insulation layer 142, is removed to form plural first openings 182. The plural first openings 182 are disposed on one side of the semi-package unit 100. Therefore, portion of the first metal layer 151 and portion of the second metal layer 152 are exposed through the corresponding first openings 182. In an embodiment, the portion of the second insulation layer 142 is removed by a laser drilling process or chemical etching process.

Then, as shown in FIG. 1M, the second carrier 17 is removed. Therefore, the second metal re-distribution layer 16 is exposed.

Then, as shown in FIG. 1N, a third metal layer 191 is provided. The third metal layer 191 is formed on the second insulation layer 142. Therefore, the third metal layer 191 is attached on the concave 181, and the third metal layer 191 is attached on the first metal layer 151 and the second metal layer 152 through the corresponding first openings 182.

Then, as shown in FIG. 1O, at least one first thin film 201 is provided. The first thin film 201 is formed on a portion of the third metal layer 191. In an embodiment, the first thin film 201 is formed on a portion of the third metal layer 191 corresponding to the area between the electronic component 13 and the thermal conduction structure 11.

Then, as shown in FIG. 1P, a first metal re-distribution layer 21 is provided. The first metal re-distribution layer 21 is formed to cover the third metal layer 191. The first metal re-distribution layer 21 is connected with the insulation structure 14, the first metal layer 151 and the second metal layer 152 through the third metal layer 191.

Then, as shown in FIG. 1Q, the first thin film 201 is removed. Therefore, plural second openings 211 are formed on the first metal re-distribution layer 21.

Then, as shown in FIG. 1R, a first mask 22 is provided. The first mask 22 is formed on the corresponding second opening 211. The position of the first mask 22 is used to separate the first metal re-distribution layer 21 connected with the first metal layer 151 and the first metal re-distribution layer 21 connected with the second metal layer 152. In an embodiment, the first mask 22 includes a resin or any other appropriate insulation material.

Then, as shown in FIG. 1S, plural fourth openings 161 are provided. The plural fourth openings 161 are formed on the second metal re-distribution layer 16. Therefore, a portion of the first insulation layer 141 is exposed.

Then, as shown in FIG. 1T, a second mask 23 is provided. The second mask 23 is formed on the second metal re-distribution layer 16. Plural fifth openings 231 are formed on the second mask 23. Therefore, a portion of the second metal re-distribution layer 16 connected with the thermal conduction structure 11 and the second metal re-distribution layer 16 connected with the second conducting terminal 132 of the electronic component 13 are exposed through the corresponding fifth openings 231. In an embodiment, the second mask 23 includes a resin or any other appropriate insulation material.

Then, as shown in FIG. 1U, a third metal re-distribution layer 24 is provided. The third metal re-distribution layer 24 is formed on the second mask 23. The third metal re-distribution layer 24 is contacted with the second metal re-distribution layer 16 connected with the thermal conduction structure 11 and the second metal re-distribution layer 16 connected with the second conducting terminal 132 of the electronic component 13 through the corresponding fifth openings 231.

Then, as shown in FIG. 1V, a third mask 25 is provided. The third mask 25 is formed on the third metal re-distribution layer 24. Plural sixth openings 251 are formed on the third mask 25. The third metal re-distribution layer 24 is exposed through the sixth openings 251, wherein the third metal re-distribution layer 24 is connected with the second metal re-distribution layer 16 connected with the thermal conduction structure 11. In an embodiment, the third mask 25 includes a resin or any other appropriate insulation material.

Then, as shown in FIG. 1W, the plural embedded structures are separated. Meanwhile, a power module 2 with the embedded package structure is fabricated.

Then, as shown in FIG. 1X, the power module 2 is disposed on a board 26. The first metal re-distribution layer 21 of the power module 2 is connected the board 26 through a conducting material 27, such as solder and to form the solder fillet. The solder fillet is formed to the wettable flank structure of the power module 2. The conducting material 27 connected with the first metal layer 151 through the first metal re-distribution layer 21 and the conducting material 27 connected with the second metal layer 152 through the first metal re-distribution layer 21 are separated with each other by the corresponding first mask 22. In an embodiment, a plural of color light beams, such as red light R, green light G and blue light B are used to irradiate the slope of the conducting material 27 with different angles. An automated optical inspection system (not shown in the figure) is disposed above the power module 2 to receive the plural light beams reflected form the surface of the conducting material 27. According to the distribution of the received light beams, the slope of the conducting material 27 can be easily determined so as to avoid poor filing quality issues. In an embodiment, a conduction layer 28 is disposed on the power module 2.

Figure 2A:
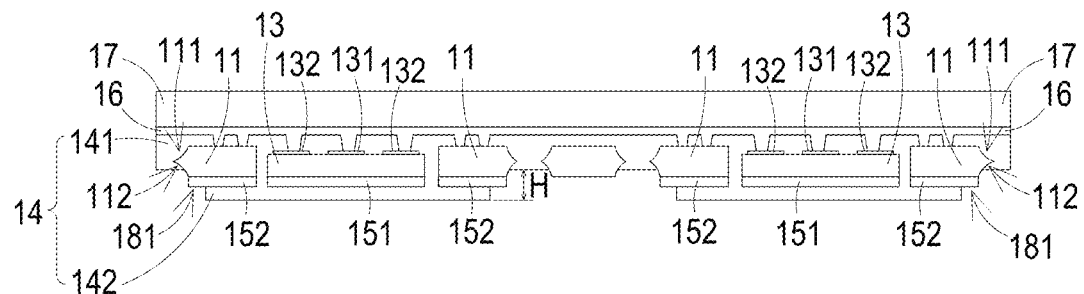
FIGS. 2A to 2N are schematic cross-sectional views illustrating a portion of a packaging process of an electronic component according to a second embodiment of the present invention.
Figure 2B:
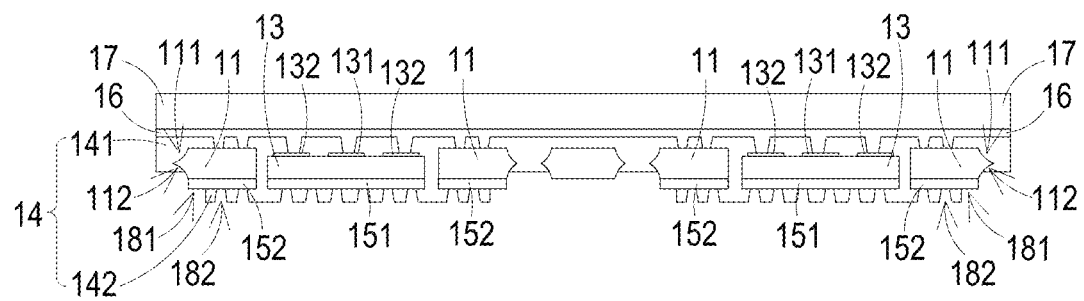
Figure 2C:
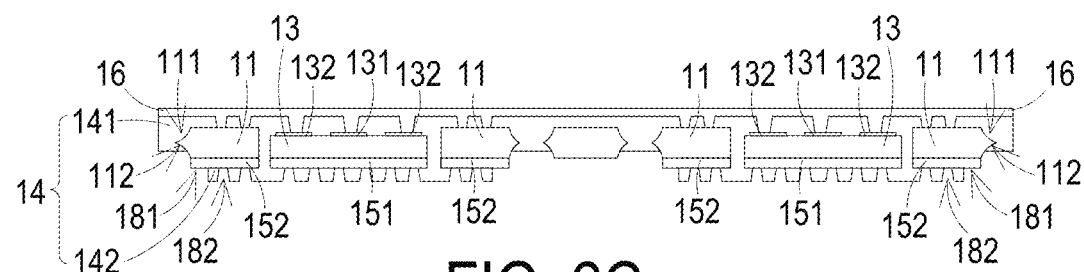
Figure 2D:
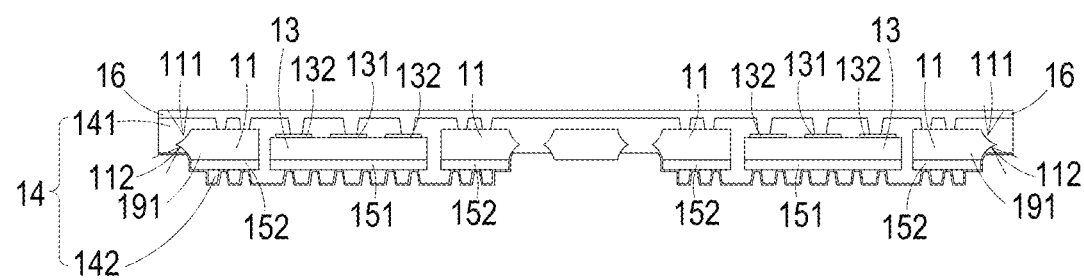
Figure 2E:
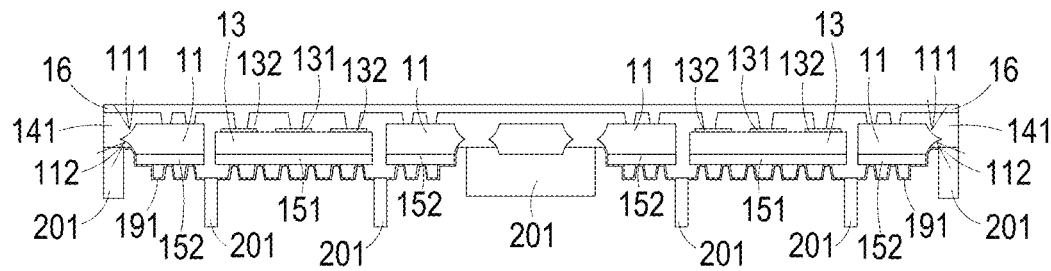
Figure 2F:
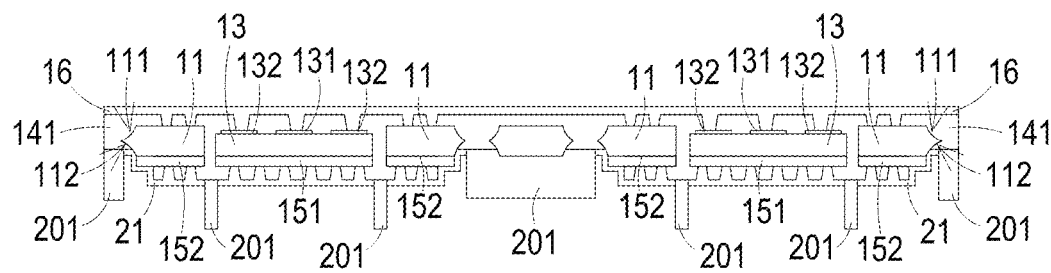
Figure 2G:
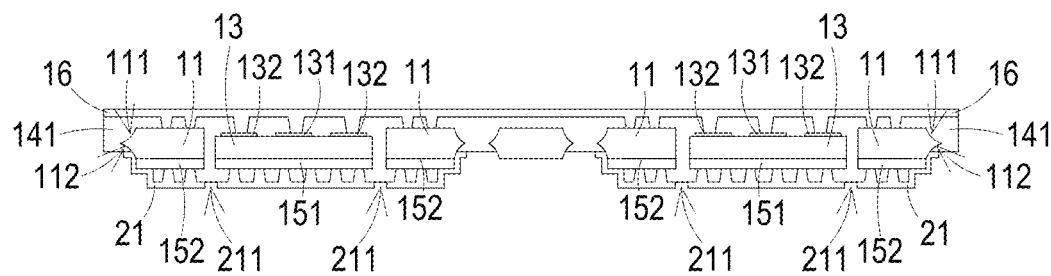
Figure 2H:
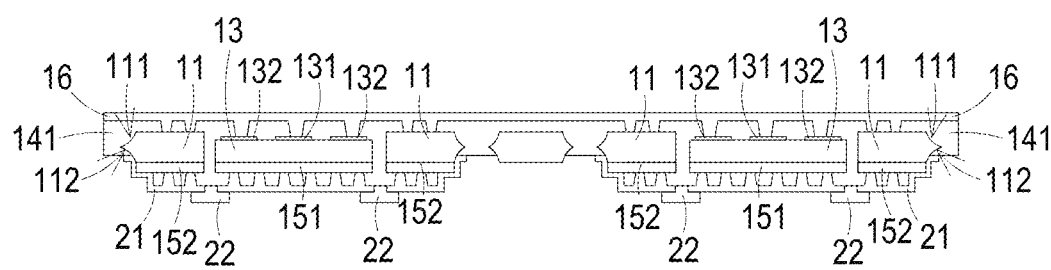
Figure 2I:
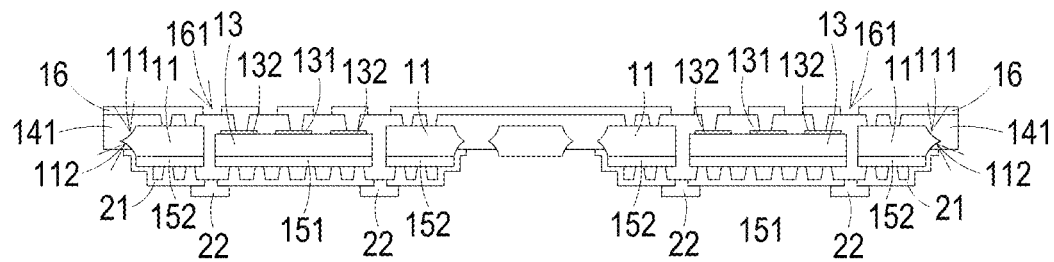
Figure 2J:
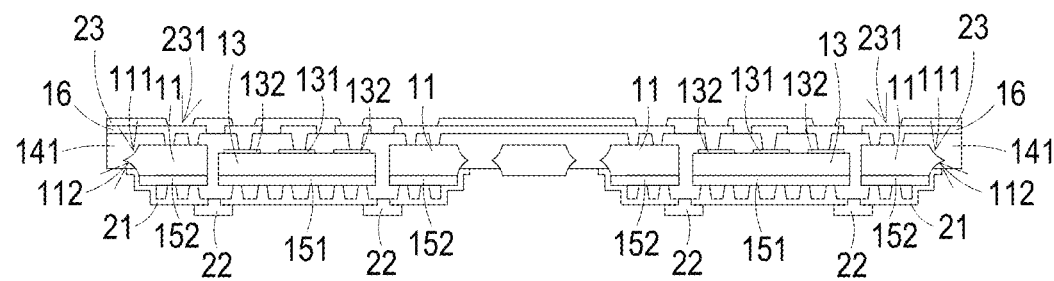
Figure 2K:
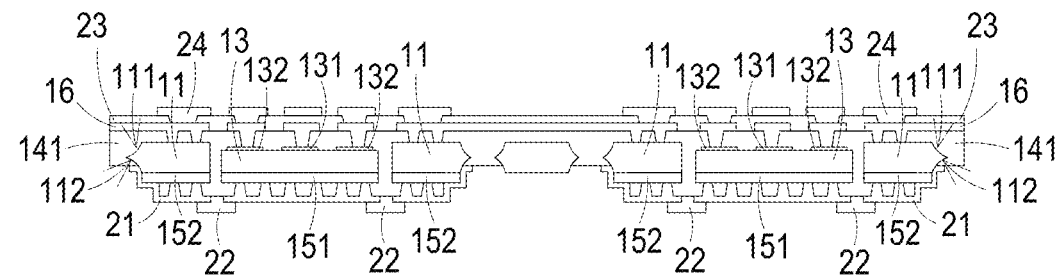
Figure 2L:
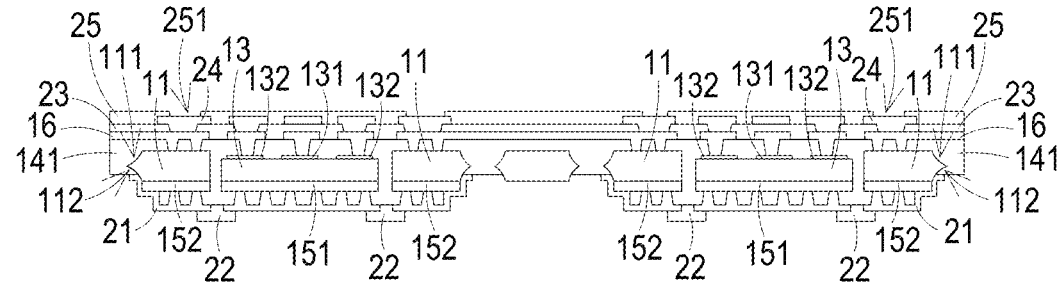
Figure 2M:
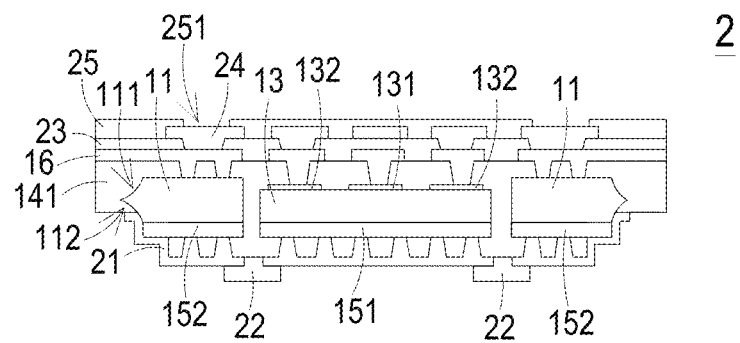
Figure 2N:
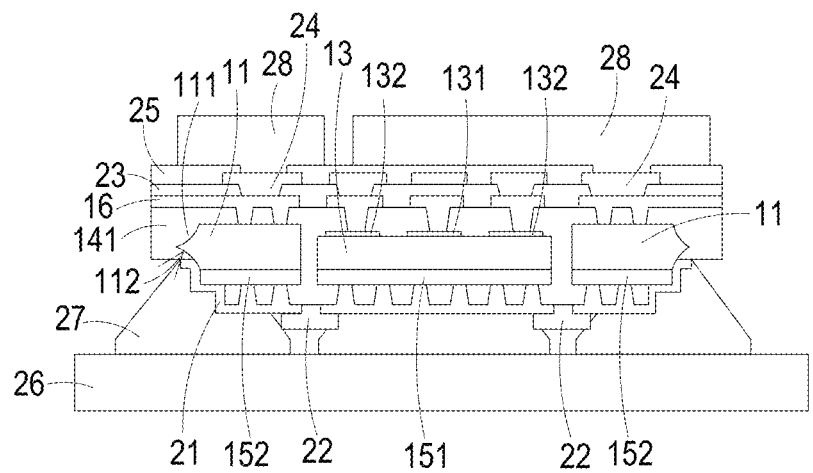

In some embodiments, FIGS. 1K to 1X of the packaging process of the disclosure are replaced with different packaging process. FIGS. 2A to 2N are schematic cross-sectional views illustrating a portion of a packaging process of an electronic component according to a second embodiment of the present invention. In an embodiment, FIGS. 1K to 1X of the packaging process of the disclosure are replaced with FIGS. 2A to 2N of the packaging process. Component parts and elements corresponding to those of the first embodiment are designated by identical numeral references, and detailed descriptions thereof are omitted.

After the packaging process of FIGS. 1A to 1J are implemented, as shown in FIG. 2A, a portion of the insulation structure 14 is removed. A side of the insulation structure 14, the second recess 112 of the thermal conduction structure 11 and a side of the second metal layer 152 is defined as a concave 181. The concave 181 is disposed on an edge of the semi-package unit 100. A portion of the thermal conduction structure 11 and a portion of the second metal layer 152 are exposed through the corresponding concave 181.

After the packaging process of FIG. 2A is implemented, the packaging process of FIGS. 2B to 2N are implemented, wherein the packaging process of FIGS. 2B to 2N are similar to the packaging process of 1L to 1X, and detailed descriptions thereof are omitted.

In some embodiments, FIGS. 1I to 1S of the packaging process of the disclosure are replaced with different packaging process. FIGS. 3A to 3F are schematic cross-sectional views illustrating a portion of a packaging process of an electronic component according to a third embodiment of the present invention. In an embodiment, FIGS. 1I to 1S of the packaging process of the disclosure are replaced with FIGS. 3A to 3F of the packaging process. Component parts and elements corresponding to those of the first embodiment are designated by identical numeral references, and detailed descriptions thereof are omitted.

Figure 3A:
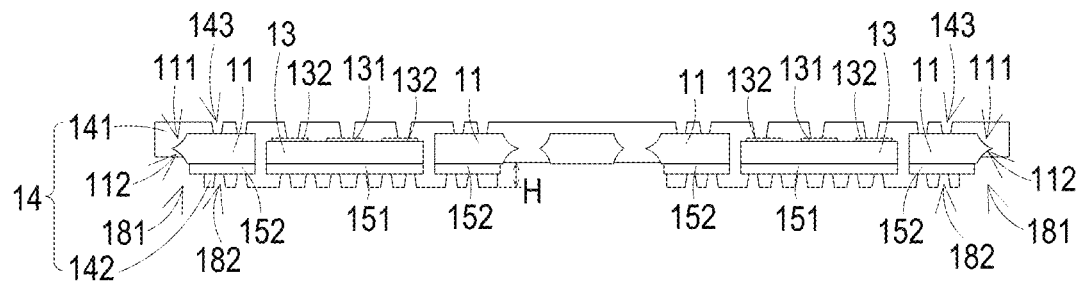
FIGS. 3A to 3F are schematic cross-sectional views illustrating a portion of a packaging process of an electronic component according to a third embodiment of the present invention.

After the packaging process of FIGS. 1A to 1H are implemented, as shown in FIG. 3A, a portion of the insulation structure 14 is removed, wherein the edge of the insulation structure 14 is formed as a groove. A side of the thermal conduction structure 11, the groove of the insulation structure 14 and a side of the second metal layer 152 is defined as a concave 181. The concave 181 is disposed on an edge and one side of the semi-package unit 100. A portion of the thermal conduction structure 11 and a portion of the second metal layer 152 are exposed through the corresponding concave 181. In an embodiment, the concave 181 is formed by a laser cavity drilling process. Preferably but not exclusively, the depth H of the concave 181 is 100 μm. Moreover, a portion of insulation structure 14, such as a portion of the second insulation layer 142, is removed to form plural first openings 182. The plural first openings 182 are disposed on one side of the semi-package unit 100. Therefore, the first metal layer 151 and the second metal layer 152 are exposed through the corresponding first openings 182.

Figure 3B:
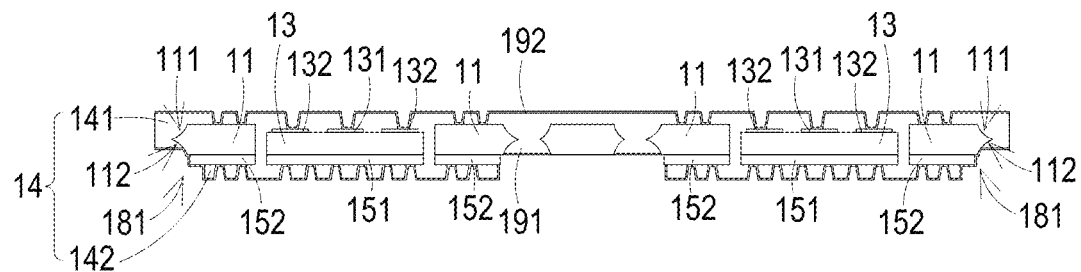

Then, as shown in FIG. 3B, a third metal layer 191 and a fourth metal layer 192 are provided. The third metal layer 191 is formed on the second insulation layer 142. Therefore, the third metal layer 191 is attached on the thermal conduction structure 11 and the first metal layer 151 through the concave 181, and the third metal layer 191 is attached on the first metal layer 151 and the second metal layer 152 through the corresponding first openings 182. The fourth metal layer 192 is formed on the first insulation layer 141. Therefore, the fourth metal layer 192 is attached on thermal conduction structure 11, the first conducting terminal 131 and the second conducting terminal 132 through the corresponding third openings 143.

Figure 3C:
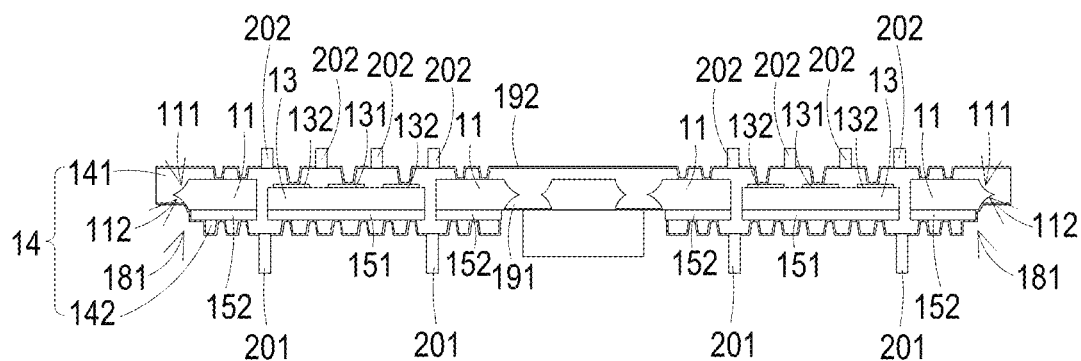

Then, as shown in FIG. 3C, at least one first thin film 201 and at least one second thin film 202 are provided. The first thin film 201 is formed on a portion of the third metal layer 191. In an embodiment, the first thin film 201 is formed on a portion of the third metal layer 191 corresponding to the area between the electronic component 13 and the thermal conduction structure 11. The second thin film 202 is formed on a portion of the fourth metal layer 192.

Figure 3D:
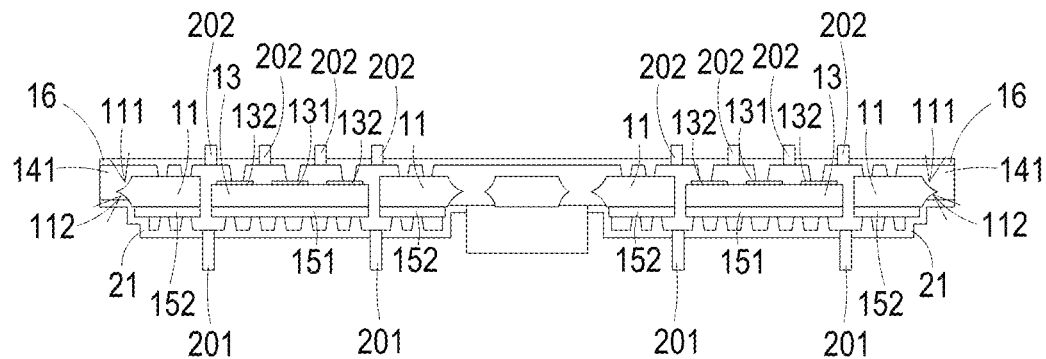

Then, as shown in FIG. 3D, a first metal re-distribution layer 21 and a second metal re-distribution layer 16 are provided. The first metal re-distribution layer 21 is formed to cover the third metal layer 191. The first metal re-distribution layer 21 is connected with the thermal conduction structure 11, the first metal layer 151 and the second metal layer 152 through the third metal layer 191. The second metal re-distribution layer 16 is formed to cover the fourth metal layer 192. The second metal re-distribution layer 16 is connected with the thermal conduction structure 11, the first conducting terminal 131 and the second conducting terminal 132 through the fourth metal layer 192.

Preferably but not exclusively, material of the fourth metal layer 192 and material of the second metal re-distribution layer 16 are identical. Therefore, the fourth metal layer 192 and the second metal re-distribution layer 16 are formed into one piece.

Figure 3E:
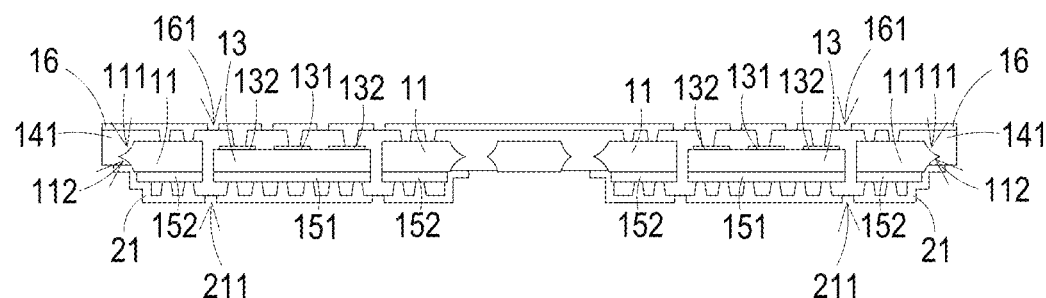

Then, as shown in FIG. 3E, the first thin film 201 and the second thin film 202 are removed. Therefore, plural second openings 211 are formed on the first metal re-distribution layer 21. Plural fourth openings 161 are formed on the second metal re-distribution layer 16.

Figure 3F:
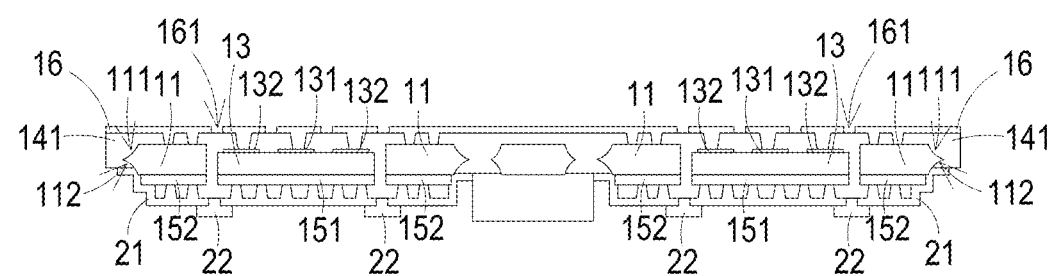

Then, as shown in FIG. 3F, a first mask 22 is provided. The first mask 22 is formed on the second openings 211. The position of the first mask 22 is used to separate the first metal re-distribution layer 21 connected with the first metal layer 151 and the first metal re-distribution layer 21 connected with the second metal layer 152. After the packaging process of FIG. 3F is implemented, the packaging process of FIGS. 1T to 1X are implemented, and detailed descriptions thereof are omitted.

Figure 4:
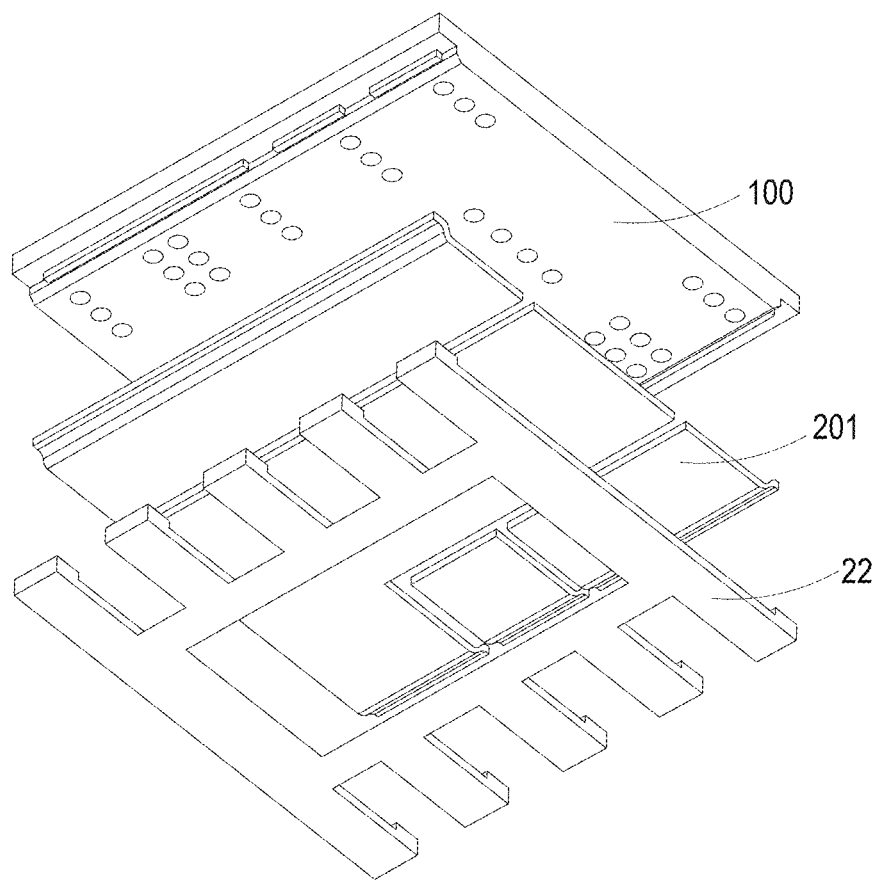
FIG. 4 is a schematic view illustrating a portion of a power module with the embedded package structure according to the present invention.

FIG. 4 is a schematic view illustrating a portion of a power module with the embedded package structure according to the present invention. As shown in FIG. 4, the first thin film 201 is disposed on the one side of the semi-package unit 100. The first mask 22 is disposed on one side of the first thin film 201.

Figure 5:
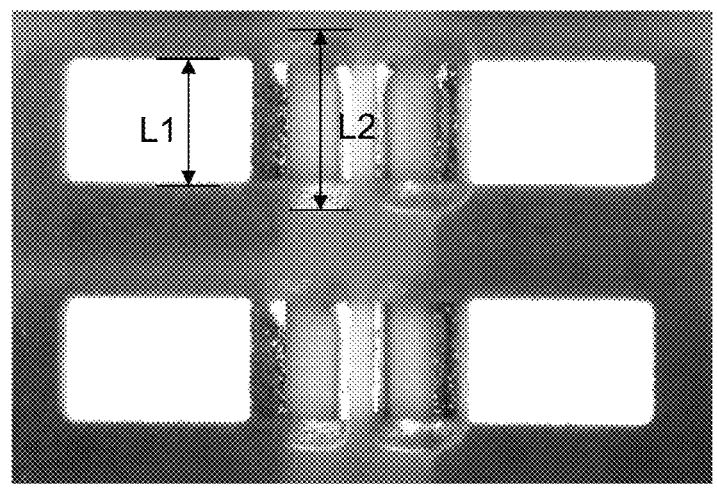
FIG. 5 is a first top view illustrating a power module with the embedded package structure according to the second embodiment of the present invention.

FIG. 5 is a first top view illustrating a power module with the embedded package structure according to the second embodiment of the present invention. As shown in FIG. 5, the width L1 of the second opening 211 is shorter than the width L2 of the concave 181. In an embodiment, the width L1 of the second opening 211 is 400 um and the width L2 of the concave 181 is 600 um.

Figure 6:
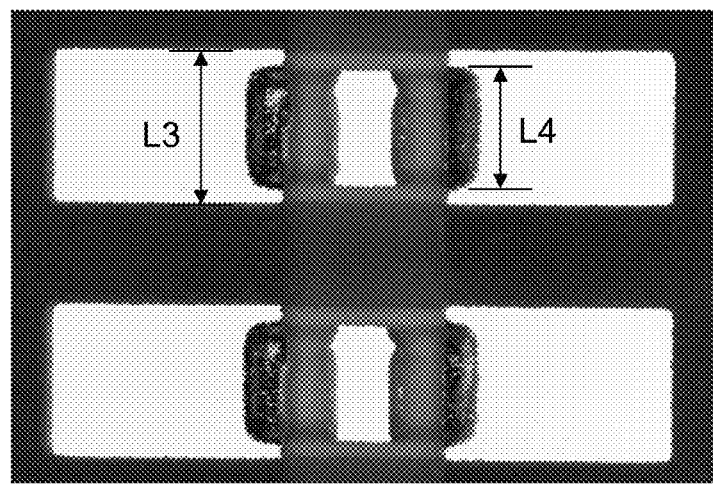
FIG. 6 is a second top view illustrating a power module with the embedded package structure according to the second embodiment of the present invention.

FIG. 6 is a second top view illustrating a power module with the embedded package structure according to the second embodiment of the present invention. As shown in FIG. 6, the width L1 of the second opening 211 is longer than the width L2 of the concave 181. In an embodiment, the width L1 of the second opening 211 is 400 um and the width L2 of the concave 181 is 320 um. In an embodiment, the width L1 of the second opening 211 is 480 um and the width L2 of the concave 181 is 400 um.

From the above description, the embodiments of the present invention provide a packaging process and a packaging structure. By the packaging process and the packaging structure of the embodiment of the present invention, the groove of the thermal conduction structure or insulation layer is covered by the first metal re-distribution layer. Therefore, the flank of the thermal conduction structure or insulation layer is easy to coat the conducting material. Moreover, because the flank of the thermal conduction structure or insulation layer is coated, the surface of the flank of the thermal conduction structure or insulation layer is difficulty oxidized. Furthermore, the conducting material between the thermal conduction structure or insulation layer and the board is flat, so that automated optical inspection of the packaging structure is easy to implement.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A packaging process comprising steps of:

(a) providing a semi-package unit comprising an electronic component, a thermal conduction structure, a first metal layer and a second metal layer embedded within an insulation structure, wherein the first metal layer is attached on the electronic component, the second metal layer is attached on the thermal conduction structure, wherein the second metal layer is not electrically connected with the electronic component;

(b) removing a portion of the insulation structure to form at least one concave disposed on an edge of the semi-package unit, and removing a portion of insulation structure to form plural first openings on one side of the semi-package unit and expose the first metal layer and the second metal layer;

(c) forming a first metal re-distribution layer to connect the insulation structure, the first metal layer and the second metal layer; and (d) forming plural second openings on the first metal re-distribution layer and forming a first mask on the second opening.

2. The packaging process according to claim 1, wherein before the step (a), the packaging process further comprises steps:

forming a first recess on an edge of the thermal conduction structure;

providing a first carrier and the electronic component, wherein one side of the electronic component comprises at least one first conducting terminal and at least one second conducting terminal, the thermal conduction structure and the other side of the electronic component are attached on the first carrier;

providing a first insulation layer on one side of the thermal conduction structure and one side of the electronic component;

removing the first carrier;

forming a second recess on the other edge of the thermal conduction structure;

forming the first metal layer on the other side of the electronic component and forming the second metal layer on the other side of the thermal conduction structure; and forming a second insulation layer on the first metal layer and the second metal layer, wherein the first insulation layer and the second insulation layer are formed into the insulation structure.

3. The packaging process according to claim 2, wherein the step (a) further comprises steps:

forming plural third openings on one side of the semi-package unit to expose the thermal conduction structure, the first conducting terminal and the second conducting terminal;

forming a second metal re-distribution layer on the first insulation layer, wherein the second metal re-distribution layer is connected with the thermal conduction structure, the first conducting terminal and the second conducting terminal; and providing a second carrier and attaching the second carrier on the second metal re-distribution layer.

4. The packaging process according to claim 3, wherein the step (b) further comprises steps of:

removing a portion of the insulation structure to form the at least one concave disposed on the edge of the semi-package unit.

5. The packaging process according to claim 3, wherein the step (b) further comprises steps:

removing the second carrier to expose the second metal re-distribution layer;

forming a third metal layer on the second insulation layer; and forming at least one first thin film on a portion of the third metal layer.

6. The packaging process according to claim 5, wherein in the step (c), the third metal layer is covered by the first metal re-distribution layer, wherein the first metal re-distribution layer is connected with the thermal conduction structure, the first metal layer and the second metal layer through the third metal layer.

7. The packaging process according to claim 5, wherein the step (c) further comprises step: removing the first thin film.

8. The packaging process according to claim 5, wherein the step (d) further comprises steps:

forming plural fourth openings on the second metal re-distribution layer;

forming a second mask on the second metal re-distribution layer, wherein plural fifth openings are formed on the second mask, wherein a portion of the second metal re-distribution layer is exposed through the plural fifth openings;

forming a third metal re-distribution layer on the second mask, wherein the third metal re-distribution layer is contacted with a portion of the second metal re-distribution layer; and forming a third mask on the third metal re-distribution layer and forming plural sixth openings to expose the third metal re-distribution layer.

9. The packaging process according to claim 2, wherein the step (a) further comprises step: forming plural third openings on one side of the semi-package unit to expose a portion of the thermal conduction structure, the first conducting terminal and the second conducting terminal.

10. The packaging process according to claim 9, wherein the step (b) further comprises steps:

forming a third metal layer on the second insulation layer to attach the thermal conduction structure, the first metal layer and the second metal layer;

forming a fourth metal layer on the first insulation layer to attach the thermal conduction structure, the first conducting terminal and the second conducting terminal;

forming at least one first thin film on a portion of the third metal layer; and forming at least one second thin film on a portion of the fourth metal layer.

11. The packaging process according to claim 10, wherein in the step (c), the third metal layer is covered by the first metal re-distribution layer, wherein the first metal re-distribution layer is connected with the thermal conduction structure, a portion of the first metal layer and a portion of the second metal layer through the fourth metal layer.

12. The packaging process according to claim 10, wherein the step (c) further comprises steps:

forming a second metal re-distribution layer on the first insulation layer, wherein the second metal re-distribution layer is connected with the thermal conduction structure, the first conducting terminal and the second conducting terminal through the corresponding third openings; and removing the first thin film to form plural fourth openings and removing the second thin film to form the plural second openings.

13. The packaging process according to claim 10, wherein in the step (c), the thermal conduction structure and the electronic component are disposed between the first metal re-distribution layer and the second metal re-distribution layer.

14. The packaging process according to claim 1, wherein in the step (b), the concave is formed by dicing saw process or laser cavity drilling process.

15. The packaging process according to claim 1, wherein a depth of the concave is 100 μm.

* * * * *